United States Patent [19]

Shinoda

[11] 4,175,252
[45] Nov. 20, 1979

[54] METER DRIVE CIRCUIT

[75] Inventor: Hatsuhiko Shinoda, Komae, Japan

[73] Assignee: Sony Corporation, Tokyo, Japan

[21] Appl. No.: 884,814

[22] Filed: Mar. 9, 1978

[30] Foreign Application Priority Data

Mar. 12, 1977 [JP] Japan .................................. 52-30274

[51] Int. Cl.² ........................ G01R 19/16; H03K 5/00
[52] U.S. Cl. ............................... 324/103 P; 307/351;
328/151
[58] Field of Search ........................... 324/103 P, 102;
307/351; 328/151

[56] References Cited

U.S. PATENT DOCUMENTS

| 2,946,013 | 7/1960 | Deighton ........................ 324/103 P |
| 3,434,053 | 3/1969 | McKee .................................. 324/132 |
| 4,069,452 | 1/1978 | Conway et al. .................. 324/103 P |

OTHER PUBLICATIONS

Peach et al., "Peak-Shift Measurements," IMB Tech. Dis. Bull., vol. 13, No. 9, Feb. 1971, pp. 2728, 2729.

Primary Examiner—Rudolph V. Rolinec
Assistant Examiner—Ernest F. Karlsen
Attorney, Agent, or Firm—Lewis H. Eslinger; Alvin Sinderbrand

[57] ABSTRACT

A meter drive circuit includes a signal input circuit through which an input signal is applied to a peak hold circuit for producing an output signal which indicates an instantaneous peak value of the input signal and which is held for a predetermined time, a sample and hold circuit for sampling the level of the output signal of the peak hold circuit, and holding the sampled level, and a signal level indicator connected to the sample and hold circuit to provide an indication of the sampled level.

9 Claims, 4 Drawing Figures

METER DRIVE CIRCUIT

BACKGROUND OF THE INVENTION

1. Field of the Invention

This invention relates generally to a meter drive circuit, and more particularly to a meter drive circuit by which the pointer of a meter may be held at a measured peak value for a predetermined time.

2. Description of the Prior Art

Generally, in a tape recorder, the preamplifier of a stereo phonograph, a radio tuner and the like, a VU-meter is provided to indicate an acoustic power level. A mean value indicator is usually used as the VU-meter. The indication provided by the mean value indicator nearly corresponds with the sound volume sensed by the ear. However, the VU-meter cannot follow pulse-like signals produced, for example, by a percussion instrument. A peak level meter having a high response speed is needed for the measurement of such pulse-like signals. The VU meter and the peak level meter are selectively made operative in accordance with the characteristics of signals to be measured.

However, when the peak level meter is employed to indicate the value of pulse-like signals of short duration, the swing of the pointer of the peak level meter is very rapid, and it is difficult to read the measured peak level.

OBJECTS AND SUMMARY OF THE INVENTION

Accordingly, it is an object of this invention to provide a meter drive circuit which overcomes the above-described disadvantages of the prior art.

Another object of this invention is to provide a meter drive circuit in which the indication of a peak level is held by a level meter for a predetermined time, and thereby it is easy to read the peak value.

In accordance with an aspect of this invention, there is provided a meter drive circuit comprising a signal input circuit for supplying an input signal to a peak hold circuit which produces an output signal corresponding to an instantaneous peak value of the input signal, and which holds such output signal for a predetermined time, a sample and hold circuit supplied with the output signal of the peak hold circuit for sampling the output signal, and holding the sampled level of the output signal, and a signal level indicator connected to the sample and hold circuit so as to provide an indication in response to the sampled level.

The above, and other objects, advantages and features of the present invention, will be readily apparent in the following detailed description which is to be read in connection with the accompanying drawings.

DESCRIPTION OF THE PREFERRED EMBODIMENT

Figure 1:
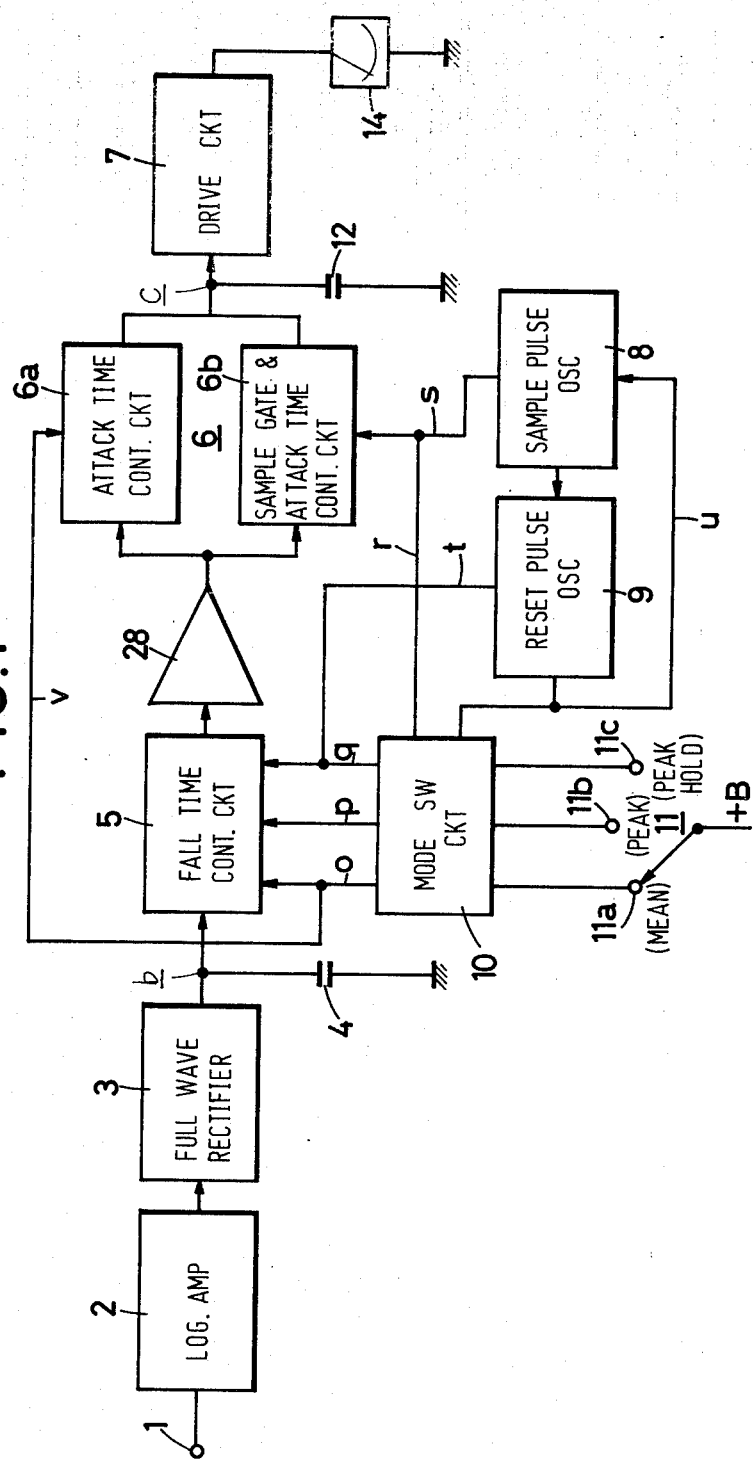
FIG. 1 is a block diagram of a meter drive circuit according to an embodiment of this invention.
Figure 2:
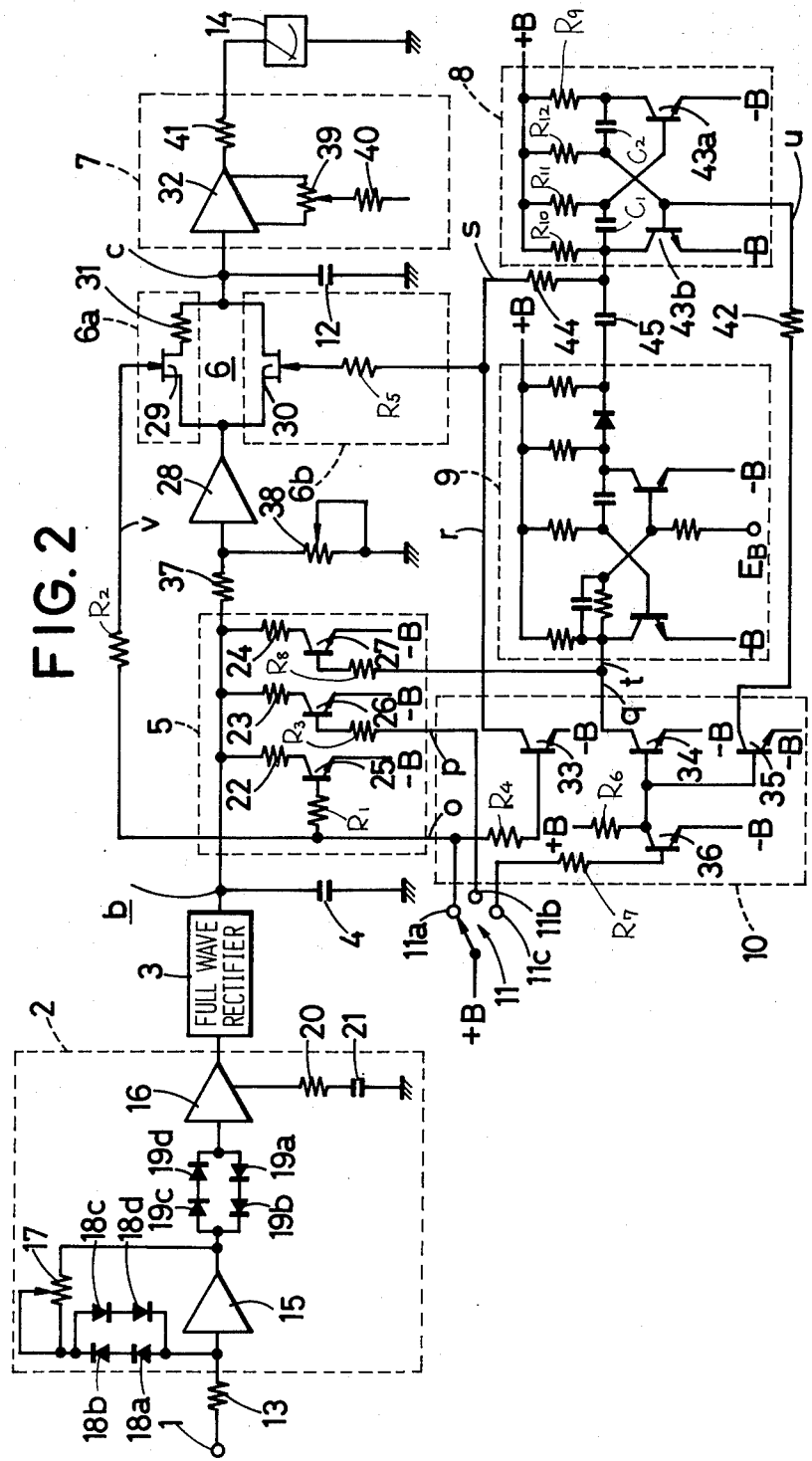
FIG. 2 is a circuit diagram showing details of the meter drive circuit of FIG. 1.

Referring to FIGS. 1 and 2, an output signal, for example, from a preamplifier, is there shown to be supplied through an input terminal 1 and a resistor 13 to a meter drive circuit embodying this invention.

The meter drive circuit is shown on FIG. 1 to generally include a logarithmic amplifier 2, a full-wave rectifier 3, a holding capacitor 4, a fall time control circuit 5, an attack time control circuit 6, a drive circuit 7, a sample pulse oscillator 8, a reset pulse oscillator 9, a mode switching circuit 10 and a change-over switch 11. In dependence on the position of change-over switch 11, a mean value, an instantaneous peak value or a sample-held peak value, of the input signal is selectively indicated by a meter 14.

The input signal is logarithmically amplified by logarithmic amplifier 2 so that the measuring range of meter 14 can be enlarged. As shown on FIG. 2, logarithmic amplifier 2 may include a first logarithmic amplifier 15 and a second logarithmic amplifier 16. A nonlinear feedback circuit which may consist of a variable resistor 17 and diodes 18a, 18b, 18c and 18d is connected to the first logarithmic amplifier 15 to logarithmically amplify the input signal. The output of first logarithmic amplifier 15 is supplied through a limiter, which may consist of diodes 19a, 19b, 19c and 19d, to the second logarithmic amplifier 16. A low-pass filter, for example, consisting of a resistor 20 and a capacitor 21, is connected to the second logarithmic amplifier 16 to eliminate unnecessary low frequency components of the input signal.

The output signal from second logarithmic amplifier 16 is supplied to full-wave rectifier 3 so that the absolute value of the voltage of the logarithmically amplified input signal will be obtained from full-wave rectifier 3. The holding capacitor 4 has its terminals connected to the output of rectifier 3 and to a reference potential, such as, ground, so as to be adapted to hold the peak voltage of the logarithmically amplified and rectified input signal which is supplied thereto from full-wave rectifier 3.

The terminal voltage of holding capacitor 4 is supplied to fall time control circuit 5 which controls the time constant for discharging the peak value from capacitor 4. Thus, fall time control circuit 5 determines the fall time of the needle of the meter 14 in accordance with the selected use of meter 14 for indication of the mean value, the instantaneous peak value or the sampled and held peak values of the input signal. As shown on FIG. 2, fall time control circuit 5 may include resistors 22, 23 and 24 having different resistance values and being connected in parallel to capacitor 4, and transducers 25, 26 and 27 having their respective collector-emitter circuits connected in series with resistors 22, 23 and 24, respectively, between the latter and a -B-power supply.

The changing voltage of capacitor 4, that is, the voltage at junction b, is supplied to buffer amplifier 28 through a voltage divider made up of a resistor 37 and a potentiometer 38 which may be manually adjusted for calibrating the scale of meter 14. The output of buffer amplifier 28 is applied to attack time control circuit 6 which, as shown, includes a circuit 6a for controlling the attack time of a sample holding capacitor 12 in the mean value mode of operation, and a circuit 6b for controlling the attack time of, and the sampling and holding by capacitor 12 in the instantaneous peak value and sampled-hold peak value modes of operation. As shown on FIG. 2, the attack time control circuit 6a may include a field effect transistor 29 having its source-drain circuit connected in series with a resistor 31 between buffer amplifier 28 and the output of circuit 6 connected to capacitor 12 at a junction or terminal c. The sample gate-attack time control circuit 6b also includes a field effect transistor 30 having its drain-source circuit connected in parallel with the series circuit constituted by the drain-source of field effect transistor 29 and resistor 31. As hereinafter described in detail, the time constant for the charging and discharging of capacitor 12 is alternatively determined by circuit 6a or by circuit 6b in accordance with the selected mode of operation or display to be provided by the meter 14.

The voltage or charge on capacitor 12 is applied to drive circuit 7 which, as shown on FIG. 2, includes a conventional drive amplifier 32. Such drive amplifier 32 may be provided with an adjusting circuit consisting of a variable resistor 39 and a resistor 40 by which the zero-point of meter 14 can be adjusted. The output signal of drive amplifier 32 is supplied to meter 14 through a resistor 41 which imparts a damping effect to the meter 14.

The meter 14 may be a voltmeter of the moving-coil type so as to indicate by its pointer the voltage or change on capacitor 12, that is, the voltage at junction or terminal c.

The chage-over or mode selecting switch 11 is shown to include a movable contact connected with a +B-power supply and being selectively engageable with stationary contacts 11a, 11b and 11c for selecting respective modes of operation in which the mean value, the instantaneous peak value or the sample-held peak value, respectively, of the input signal is indicated by meter 14. Stationary contact 11a is shown to be connected through a line o and a resistor $R_1$ with the base of transistor 25 and through a line v and a resistor $R_2$ with the gate of field effect transistor 29 so that transistors 25 and 29 are turned ON in response to the engagement of the movable contact of switch 11 with its stationary contact 11a. The stationary contact 11b of switch 11 is shown to be connected through a line p and a resistor $R_3$ to the base of transistor 26 so that the latter is turned ON in response to the engagement of the movable contact of switch 11 with its stationary contact 11b.

As is shown on FIG. 2, mode switching circuit 10 may include transistors 33, 34, 35 and 36 all having their emitters connected to the −B-power supply. The transistor 33 is shown to have its base connected through a resistor $R_4$ with stationary contact 11a of switch 11 so that transistor 33 is also turned ON in response to the engagement of the movable contact of switch 11 with stationary contact 11a. The collector of transistor 33 is connected through a line r and resistor $R_5$ with the gate of field effect transistor 30 so that the latter is positively turned OFF when transistor 33 is turned ON in response to the engagement of the movable contact of switch 11 with stationary contact 11a. The +B-power supply is further shown on FIG. 2 to be connected through a resistor $R_6$ with the base of transistor 34 and the base of transistor 35, and also with the collector of transistor 36. Further, the base of transistor 36 is connected through a resistor $R_7$ with stationary contact 11c of switch 11 so that, when the movable contact of that switch engages stationary contact 11c, transistor 36 is turned ON and, as a result thereof, transistors 34 and 35 are turned OFF from their normal ON condition. Transistor 34 has its collector connected through a line q and a resistor $R_8$ with the base of transistor 27 so that the latter is positively turned OFF when transistor 34 is in its normal ON condition. Transistor 35 has its collector connected through a resistor 42 and a line u to sample pulse oscillator 8 to render the latter inactive, that is, to prevent the generation of sampling pulses by oscillator 8, so long as transistor 35 is turned ON.

As is shown on FIG. 2, sampling pulse oscillator 8 may be constituted by an astable multivibrator including transistor 43a and 43b having their collectors connected with the +B-power supply through resistors $R_9$ and $R_{10}$, respectively, while the emitters of both transistors 43a and 43b are connected with the −B-power supply. Further, as shown, the base of transistor 43a is connected with the +B-power supply by way of a resistor $R_{11}$ and with the collector of transistor 43b by way of a capacitor $C_1$. Similarly, the base of transistor 43b is connected with the +B-power supply by way of a resistor $R_{12}$, and with the collector of transistor 43a by way of a capacitor $C_2$. Finally, the previously-mentioned line u from mode switching circuit 10 is connected to the base of transistor 43b so that the voltage of the −B-voltage supply is applied to the base of transistor 43b to maintain the latter in its OFF condition so long as transistor 35 is turned ON. The collector of transistor 43b, which constitutes the output of sample pulse oscillator 8, is connected through a resistor 44 and a line s to the resistor $R_5$ leading to the gate of field effect transistor 30. Further, the collector of transistor 43b is connected through a capacitor 45 with the input of reset pulse oscillator 9. As shown on FIG. 2, reset pulse oscillator 9 may be in the form of a monostable multivibrator which is triggered by each sampling pulse applied thereto from sampling pulse oscillator 8 through capacitor 45. Thus, each sampling pulse issuing from oscillator 8 is followed by a reset pulse issuing from oscillator 9 and being supplied from the latter to the base of transistor 27 by way of a line t and resistor $R_8$.

The above-described meter drive circuit in accordance with this invention operates ad follows:

MEAN VALUE INDICATING MODE

When it is desired that meter 14 indicate the mean value of an input signal applied to terminal 1, the movable contact of change-over switch 11 is engaged with stationary contact 11a. In such position of switch 11, the voltage of +B-power supply is applied through line o and resistor $R_1$ to the base of transistor 25, through line v and resistor $R_2$ to the gate of field effect transistor 29, and through resistor $R_4$ to the base of transistor 33. Accordingly, transistors 25, 29 and 33 are turned ON. Since the other stationary contacts 11b and 11c of switch 11 are disconnected from the +B-power supply, transistors 26 and 36 are turned OFF while transistors 34 and 35 are turned ON. Further, in consequence of transistor 34 being turned ON, transistor 27 is turned OFF.

With transistor 25 being turned ON in fall time control circuit 5, discharging of capacitor 4 occurs through resistor 22 and hence the rate of such discharge is controlled by the value of resistor 22. Since transistor 29 is turned ON, the charging and discharging of sample holding capacitor 12 occurs through transistor 29 and resistor 31 at a rate determined by the latter. In connection with the foregoing, it should be noted that the buffer amplifier 28 has a low output impedance so that the discharge of capacitor 12 may occur into buffer amplifier 28. Since transistor 33 is turned ON in the presently described mode of operation, it will be apparent that the voltage of the −B-power supply is applied through line r and resistor $R_5$ to the gate of field effect transistor 30 so as to maintain the latter in its OFF condition.

Figure 3:
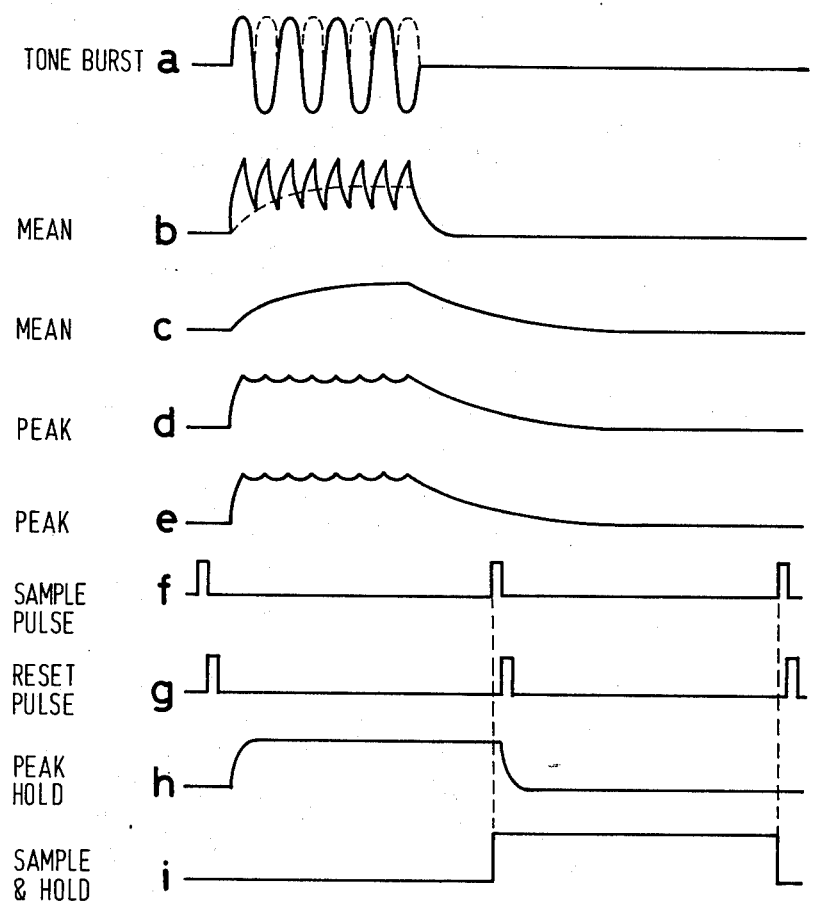
FIGS. 3 and 4 show wave forms to which reference will be made in explaining the operation of the meter drive circuit of FIGS. 1 and 2.

It it is assumed that a tone burst signal of predetermined amplitude, frequency and duration, for example, as shown on FIG. 3a, is supplied to input terminal 1 of the meter drive circuit when the latter is in its mean value indicating mode, as described above, such tone burst signal is logarithmically amplified by amplifier 2 and then supplied to rectifier 3 where it is subjected to full wave rectifying, for example, as indicated by the broken lines on FIG. 3a with respect to the negative portions of the tone burst signal. The rectified signal is supplied to capacitor 4 to charge the latter, and the voltage of capacitor 4 is discharged through resistor 22 and turned ON transistor 25 at the rate determined by the value of resistor 22 which, by way of example, may be 220 K$\Omega$. Thus, as shown in solid lines on FIG. 3b, the terminal voltage of capacitor 4, that is, the voltage at junction b on FIG. 2, varies with a predetermined time constant at which capacitor 4 is repeatedly charged and discharged. The terminal voltage of holding capacitor 4 is supplied through the voltage divider consisting of resistor 37 and variable resistor 38 to buffer amplifier 28, and the output of amplifier 28 is applied through the turned ON transistor 29 and resistor 31 to sample holding capacitor 12. The resistor 31 has a relatively high resistance, for example, a resistance of 1 M$\Omega$, so that capacitor 12 will have a relatively large charging time constant, for example, of about 300 milliseconds. As a result of the foregoing, the terminal voltage of capacitor 12, that is, the voltage at the junction c on FIG. 2, changes gradually as represented by the broken line on FIG. 3b and the solid line on FIG. 3c. In other words, the ripple component is eliminated from the output voltage of buffer amplifier 28 and the mean value of the input signal is obtained at capacitor 12 and is supplied through drive circuit 7 to meter 14.

INSTANTANEOUS PEAK VALUE INDICATING MODE

When the movable contact of change-over switch 11 is manually displaced to engage stationary contact 11b for causing meter 14 to indicate the instantaneous peak value of the input signal, the voltage of +B-power supply is supplied through line p and resistor $R_3$ to the base of transistor 26 so that the latter is turned ON. Accordingly, resistor 23 is selected for determining the discharging rate of holding capacitor 4. Since the voltage of the +B-power supply is not supplied to stationary contacts 11a and 11c, transistor 25 in fall time control circuit 5, and transistors 33 and 36 in mode switching circuit 10 are turned OFF. Accordingly, transistor 34 is turned ON, and the voltage of the −B-power supply is applied through line q to the base of transistor 27 so as to turn OFF the latter.

Further, the voltage of the +B-power supply is still applied through resistor $R_6$ to the base of transistor 35 to turn ON the latter and thus connect the base of transistor 43b in sample pulse oscillator 8 with the −B-power supply by way of line u, resistor 42 and turned ON transistor 35. By reason of the foregoing, transistor 43b is maintained in its OFF condition. Thus, the voltage of the +B-power supply is supplied through resistor $R_{10}$, resistor 44 in line s and resistor $R_5$ to the gate of field effect transistor 30 so that the latter is turned ON continuously for so long as switch 11 is disposed to select the instantaneous peak value indicating mode. Accordingly, the output voltage of buffer amplifier 28 is applied to sample holding capacitor 12 through transistor 30, and not through transistor 29 and resistor 31, as in the previously-described mode of operation. Further, capacitor 12 is dischargeable through transistor 30 and buffer amplifier 28 which, as previously noted, has a low output impedance.

When the tone burst signal of FIG. 3a is supplied to input terminal 1 with the meter drive circuit in its instantaneous peak value indicating mode of operation, the rectified input signal is supplied from rectifier 3 to holding capacitor 4 for charging the latter, and capacitor 4 is discharged through resistor 23 and the associated turned ON transistor 26 to the −B-power supply. The resistor 23 is provided with a relatively large resistance value, for example, a resistance of about 3.3 M$\Omega$ so that capacitor 4 is charged nearly to the peak value of the full wave-rectified input signal, as shown on FIG. 3d.

The terminal voltage of holding capacitor 4 at junction b on FIG. 2 is supplied through buffer amplifier 28 and turned ON transistor 30 to capacitor 12. Since the resistance interposed in the circuit for charging capacitor 12 by way of transistor 30 is nearly zero, capacitor 12 is very rapidly charged. Accordingly, the terminal voltage of capacitor 12 at junction c is shown on FIG. 3e to vary almost identically with the terminal voltage of capacitor 4 as shown on FIG. 3d. The terminal voltage of capacitor 12 is supplied through drive circuit 7 to meter 14 with the result that the instantaneous peak value of the input signal is indicated by the meter.

SAMPLED-HOLD PEAK VALUE INDICATING MODE

When change-over switch 11 is manipulated to engage its movable contact with stationary contact 11c the meter drive circuit is conditioned to cause meter 14 to indicate the sampled-hold peak value of the input signal. More particularly, the engagement of the movable contact of switch 11 with stationary contact 11c causes the voltage of the +B-power supply to be supplied to the base of transistor 36 so that the latter is turned ON and, as a result thereof, transistor 34 and 35 are turned OFF. In response to the OFF condition of transistor 35, sampling pulse oscillator 8 is made operative to generate sampling pulses (FIG. 3f) at predetermined intervals. Such sampling pulses from oscillator 8 are supplied through resistor 44 in line s and resistor $R_5$ to the gate of field effect transistor 30. Thus, transistor 30 is turned ON intermittently in response to the sampling pulses from oscillator 8 and, during each short period when transistor 30 is turned ON, the output voltage of buffer amplifier 28 is applied through transistor 30 to the sample holding capacitor 12 for charging the latter.

Each sampling pulse from oscillator 8 is further supplied through capacitor 45 to the reset pulse oscillator 9 for triggering the latter and thereby causing oscillator 9 to provide a reset pulse (FIG. 3g) having a predetermined pulse width and commencing at the trailing edge or falling side of each sampling pulse. Since transistor 34 in mode switching circuit 10 is turned OFF, each reset pulse from oscillator 9 is applied through line t to the base of transistor 27 in the fall time control circuit 5. Thus, transistor 27 is turned ON momentarily by each reset pulse from oscillator 9 to discharge capacitor 4 through resistor 24 to the −B-power supply. It will be appreciated that, in the sample-hold peak value indicating mode of operation, transistors 25 and 26 in fall time control circuit 5, transistor 29 in attack time control circuit 6a and transistor 33 is mode switching circuit 10 are all turned OFF.

When the tone burst signal of FIG. 3a is applied to input terminal 1 with switch 11 disposed to provide the sample-hold peak value indicating mode of operation of the meter drive circuit, holding capacitor 4 is charged with the peak voltage of the rectified input signal from rectifier 3. As shown on FIG. 3h, the charging voltage of capacitor 4 is maintained or held at the peak value until transistor 27 is turned ON in response to a reset pulse (FIG. 3g) from oscillator 9, whereupon the charging voltage of capacitor 4 is discharged through resistor 24. Resistor 24 is provided with a resistance value, for example, of about 1.5 K$\Omega$, so that the charging voltage of capacitor 4 is relatively rapidly discharged to the $-$B-power supply in response to the turning ON of transistor 27, as shown on FIG. 3h.

The terminal voltage of holding capacitor 4 at junction b is supplied through buffer amplifier 28 to transistor 30. Whenever a sampling pulse (FIG. 3f) is applied to the gate of transistor 30 so as to turn ON the latter, the sample holding capacitor 12 is charged with the peak charging voltage then appearing on holding capacitor 4. The charging voltage of capacitor 12 at junction c is held at the sampled peak value for a predetermined time, as shown in FIG. 3i, until the next sampling pulse is applied to the gate of transistor 30. The sampling pulses from oscillator 8 have a suitably long period therebetween, for example, of about 0.6 seconds. The terminal voltage of sample holding capacitor 12, that is, the voltage at junction c, is applied through drive circuit 7 to meter 14 so that the peak value of the voltage held for a predetermined time by capacitor 12 is indicated for such time by meter 14. Thus, in the described example, each peak value of the input signal is indicated by meter 14 for 0.6 seconds.

It will be appreciated that, if the charging voltage of capacitor 12 is lower than the output voltage of buffer amplifier 28, that is, lower than the terminal voltage of holding capacitor 4, at the time when a sampling pulse is applied from oscillator 8 to the gate of transistor 30 for turning ON the latter, then capacitor 12 is charged through transistor 30. On the other hand, if the output voltage of buffer amplifier 28, that is, the terminal voltage of holding capacitor 4, is lower than the voltage on sample holding capacitor 12, that is, lower than the previously sampled value, at the time when a sampling pulse is applied to the gate of transistor 30 for turning ON the latter, the charging voltage of capacitor 12 is rapidly discharged through transistor 30 and buffer amplifier 28 having a low output impedance, until the charging voltage of capacitor 12 becomes equal to the output voltage of buffer amplifier 28.

Figure 4:
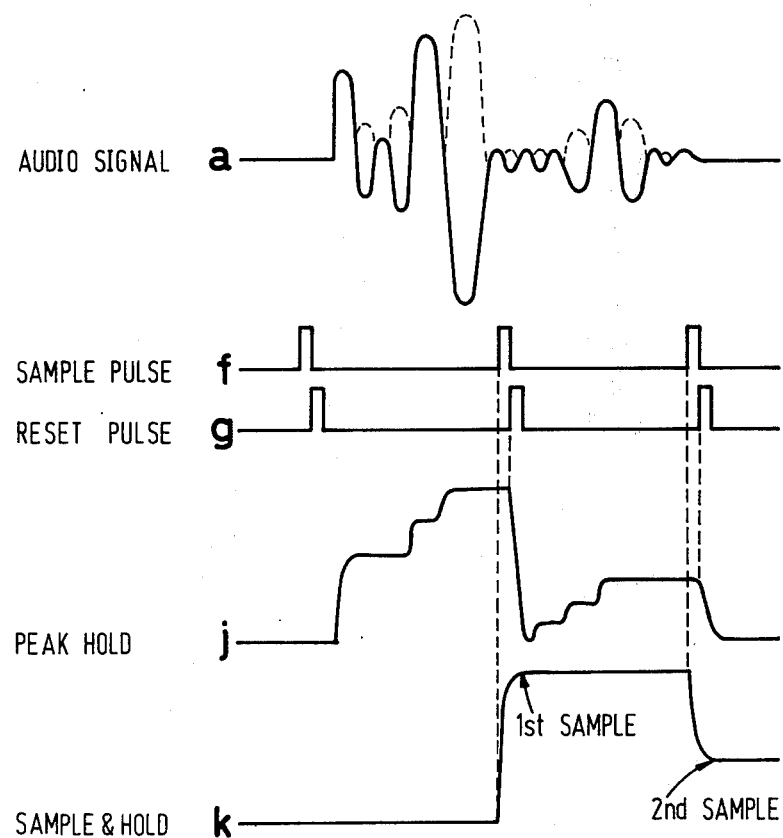

Having described the operation of the meter drive circuit according to this invention in the case where a tone burst signal of predetermined amplitude, frequency and duration is supplied to the input terminal, the operation of the meter drive circuit in the sample-hold peak value indicating mode will now be further described for the case in which a conventional audio signal, such as is shown on FIG. 4a is supplied to the input terminal.

Such audio signal is subjected to full wave rectification in rectifier 3, as indicated in broken lines on FIG. 4a with respect to the negative portions of the audio signal. The holding capacitor 4 is charged with the peak voltage of the rectified input signal, and the charging voltage of capacitor 4 is discharged through resistor 24 and transistor 27 whenever a reset pulse (FIG. 4a) is supplied to the base of transistor 27. As a result of the foregoing, the terminal voltage of capacitor 4, that is, the voltage at junction b, varies in the manner shown on FIG. 4j which indicates that the voltage on capacitor 4 at the occurrence of a sampling pulse (FIG. 5f) is the peak voltage value of the rectified signal occurring in the interval between such sampling pulse and the preceeding reset pulse (FIG. 4g). Whenever a sampling pulse is applied to the gate of transistor 30 to turn ON the latter, the then existing peak voltage of capacitor 4, as obtained at the output of buffer amplifier 28, is sampled and charges the sample-holding capacitor 12. The peak value or level of the output of buffer amplifier 28 which is sampled in response to a sampling pulse from oscillator 8, for example, as indicated by the legend "first sample" on FIG. 4k, is held by capacitor 12 for a predetermined time, that is, until the next sampling pulse is applied from oscillator 8 to the gate of transistor 30, whereupon, transistor 30 is again turned ON to permit capacitor 12 to sample and hold the "second sample" of the output of buffer amplifier 28.

Since the peak value of the audio signal is sampled and held as a charging voltage on capacitor 12 for the period between successive sampling pulses, such charging voltage on capacitor 12, when applied through drive circuit 7 to meter 14, causes the latter to similarly indicate the peak value for the period, for example, of 0.6 seconds, between successive sampling pulses so that the indication of the peak value can be easily read.

It will be apparent from the foregoing that, in a meter drive circuit according to this invention, such circuit can be changed-over to a sample-hold peak value indicating mode of operation in which the peak value of the input signal is held, for example, on capacitor 4, the held peak value is sampled at predetermined intervals, for example, in response to sampling pulses applied to transistor 30 in circuit 6b, and the sampled level of the held peak value is held for a predetermined time, for example, on capacitor 12, so as to drive the meter 14. Thus, the meter 14 provides an indication of each peak value for a predetermined time equivalent to the period or interval between successive sampling pulses. Accordingly, even when the level of the input signal changes rapidly or sharply and frequently, it is easy to read the peak value of the input signal.

Although the above-described meter drive circuit according to this invention applies the input signal to the full-wave rectifier 3 by way of a logarithmic amplifier 2, it is to be appreciated that the logarithmic amplifier is not necessary for the purposes of the present invention.

Having described a preferred embodiment of the invention with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:
1. A meter drive circuit comprising:
signal input means for supplying an input signal;
peak hold means for providing an output signal which represents the level of the peak value of the input signal occurring during a predetermined period, and for holding said output signal for the duration of such predetermined period;

sample and hold means for sampling the level of said output signal from the peak hold means and for holding the sampled level of said output signal, said sample and hold means including a sampling gate circuit operative to pass said output signal from said peak hold means, a hold circuit connected to said sampling gate circuit for holding the output signal passed by said sample gate circuit, a sampling pulse oscillator to apply a sampling pulse to said sampling gate circuit for making the latter operative, and a reset pulse oscillator connected to said peak hold means for providing a reset pulse to reset said output signal after said sampling gate circuit is made operative; and a signal level indicator connected to said sample and hold means for providing an indication of said sampled level which is being held in said sample and hold means.

2. A meter drive circuit according to claim 1; in which said peak hold means includes rectifier means connected to said signal input means, and a fall time control circuit connected between said rectifier means and said sampling gate circuit.

3. A meter drive circuit according to claim 2; in which said fall time control circuit includes a capacitor connected to said rectifier means, a transistor having a collector-emitter circuit, and a resistor in series with said collector-emitter circuit in a series circuit connected in parallel with said capacitor, said transistor having a base which is supplied with reset pulse from the reset pulse oscillator.

4. A meter drive circuit according to claim 1; in which said sampling gate circuit includes a transistor having first, second and third electrodes, and said hold circuit includes a capacitor having opposed terminals; and in which the first and second electrodes of said transistor are connected between said peak hold means and one of said terminals of said capacitor, the other of said terminals of the capacitor is connected to a reference point, and the third electrode of said transistor is supplied with said sampling pulse from the sampling pulse oscillator.

5. A meter drive circuit according to claim 4; in which said transistor is in the form of a field effect transistor having source, drain and gate electrodes; and in which said source and drain electrodes of the field effect transistor are said first and second electrodes, respectively, and said gate electrode is said third electrode to be supplied with the sampling pulse from said sampling pulse oscillator.

6. A meter drive circuit according to claim 1; further comprising: a buffer amplifier connected between said peak hold means and said sampling gate circuit; and a drive amplifier connected between said hold circuit and said signal level indicator.

7. A meter drive circuit according to claim 1; in which said sampling pulse oscillator includes an astable-multivibrator, and said reset pulse oscillator includes a monostable-multivibrator.

8. A meter drive circuit according to claim 7; in which said monostable-multivibrator is triggered in response to an output of said astable-multivibrator.

9. A meter drive circuit comprising: signal input means for supplying an input signal; peak hold means for providing an output signal which represents the level of the peak value of the input signal occurring during a predetermined period, and for holding said output signal for the duration of such predetermined period; sample and hold means for sampling the level of said output signal from the peak hold means and for holding the sampled output of said output signal; a signal level indicator adapted to be connected to said sample and hold means for providing an indication of said sampled level which is being held in said sample and hold means; a peak level detector supplied with said input signal from said signal input means; a mean-value level detector supplied with said input signal from said signal input means; and switching means for selectively applying one of the output signals of said sample and hold means, said peak level dectector and said mean-value level detector to said signal level indicator.

* * * * *